United States Patent
Shinagawa et al.

[11] Patent Number: 5,808,473
[45] Date of Patent: *Sep. 15, 1998

[54] ELECTRIC SIGNAL MEASUREMENT APPARATUS USING ELECTRO-OPTIC SAMPLING BY ONE POINT CONTACT

[75] Inventors: Mitsuru Shinagawa; Tadao Nagatsuma; Makoto Yaita, all of Isehara; Ken Takeya, Atsugi, all of Japan

[73] Assignee: Nippon Telegraph & Telephone Corp., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 511,095
[22] Filed: Aug. 3, 1995

[30] Foreign Application Priority Data

Aug. 4, 1994 [JP] Japan ................................ 6-183467
Jan. 27, 1995 [JP] Japan ................................ 7-011545

[51] Int. Cl.$^6$ .............................................. G01R 31/308
[52] U.S. Cl. ........................ 324/753; 324/750; 324/752
[58] Field of Search ............................. 324/96, 753, 72, 324/750, 752; 359/246, 252, 315

[56] References Cited

U.S. PATENT DOCUMENTS 4,864,222  9/1989  Aoshima et al. ........................ 324/96
4,887,026  12/1989  Takahashi et al. ...................... 324/96
5,055,770  10/1991  Takahashi et al. ...................... 324/96
5,272,433  12/1993  Simonelli ............................... 324/96
5,331,275  7/1994  Ozaki et al. ........................... 324/757
5,412,330  5/1995  Ravel et al. ........................... 324/753

FOREIGN PATENT DOCUMENTS

P63-196863  8/1988  Japan .
P6-95110  11/1994  Japan .

*Primary Examiner*—Josie Ballato
*Assistant Examiner*—Russell M. Kobert
*Attorney, Agent, or Firm*—Banner & Witcoff Ltd

[57] ABSTRACT

An electric signal measurement apparatus using the electro-optic sampling which is capable of measuring electric signals propagating on a signal line with only a lower disturbance, in a high precision over a wide bandwidth, and economically by a relatively compact apparatus size. The apparatus has a conductor body to be set in one point contact with the signal line, and an electro-optic material which changes a birefringence according to a strength of an electric field coupled by the conductor body, and which has a sufficient thickness between the lower surface and an upper surface such that a potential at the upper surface due to the electric field coupled by the conductor body is effectively zero. A polarization detector for detecting the laser beam with a polarization changed due to a change of the birefringence of the electro-optic material can be provided within a handy type probe body to which a probe head is attached.

38 Claims, 13 Drawing Sheets

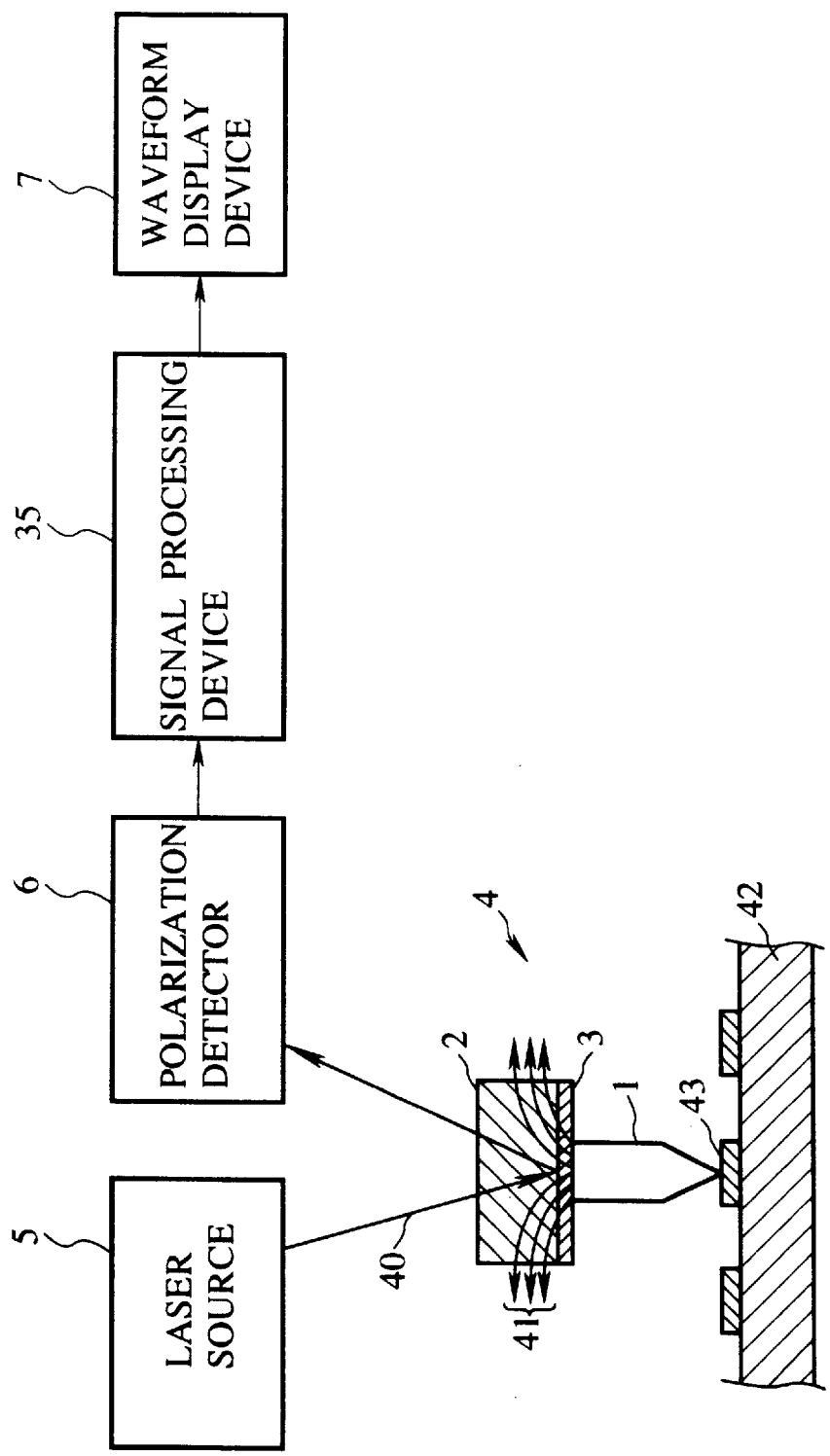

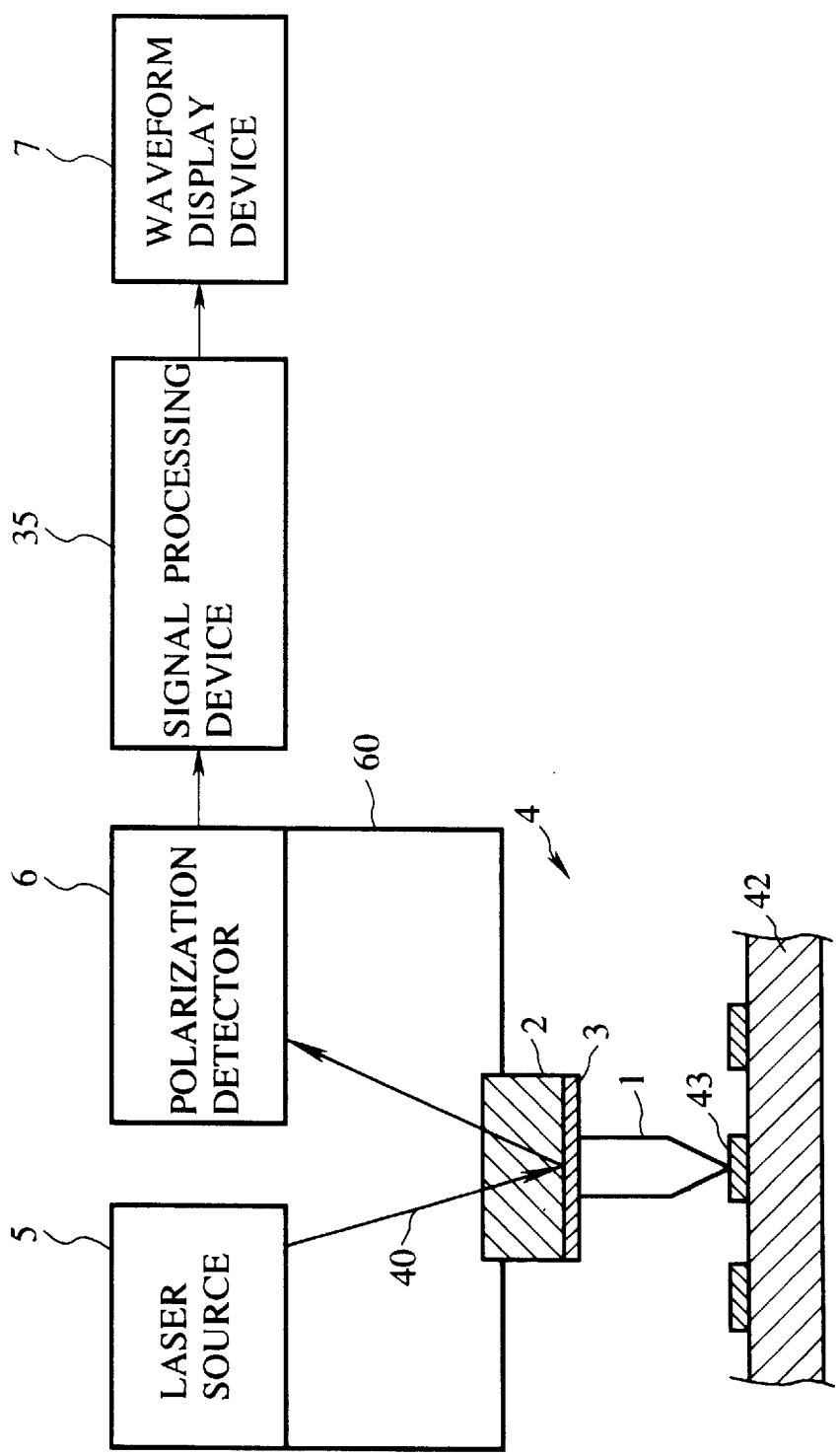

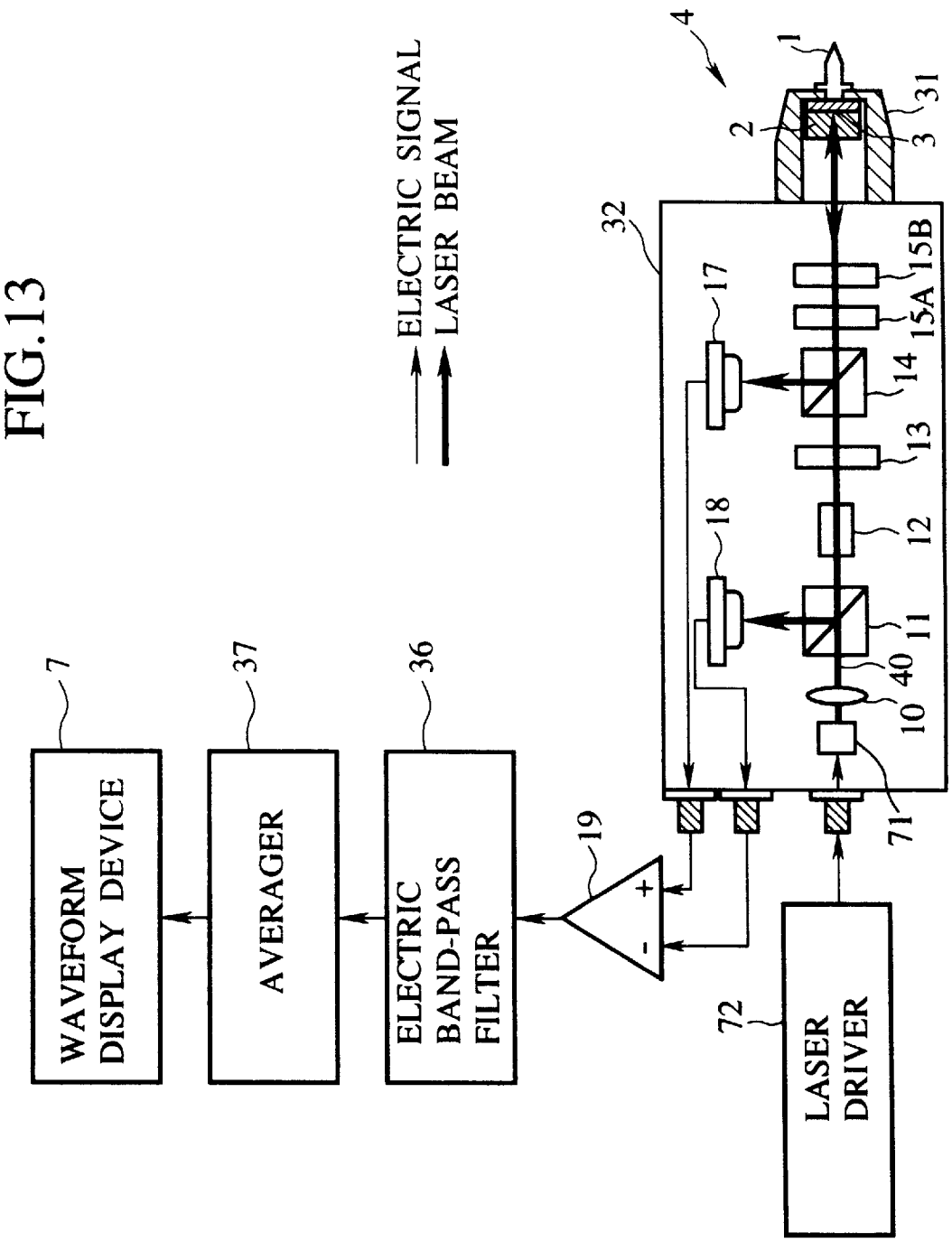

(a)

(b)

(c)

(d)

ELECTRIC SIGNAL MEASUREMENT APPARATUS USING ELECTRO-OPTIC SAMPLING BY ONE POINT CONTACT

BACKGROUND OF THE INVENTION

1. Field of the Invention

The present invention relates to an electric signal measurement apparatus for measuring electric signals propagating on a signal line provided in an integrated circuit, a packaging board, a printed circuit board, or the like, by using an electro-optic sampling.

2. Description of the Background Art

As a conventional electric signal measurement apparatus, an FET probe as shown in FIG. 1 has been known. In this FET probe, a probe head 52 and a ground line 53 are set in contact at two points with a signal line 43 and a ground 44 of a measurement target circuit 42, to extract a slight amount of currents from the signal line 43. Then, the currents extracted from the signal line 43 are entered into an FET input signal amplifier 51 having a high input impedance via a coaxial cable 50, to measure the electric signal propagating on the signal line 43, and a waveform of the measured electric signal is displayed on a waveform display device 57

In this FET probe, it is necessary for the probe to make two point contacts with a measurement target circuit, so that when there is no ground nearby a measurement target point, it is not possible to carry out a broad-band measurement. In addition, the currents are going to be extracted from the signal line, albeit in a slight amount, so that when a measurement target circuit has a low driving power, a measurement target signal can be changed due to a disturbance received by a measurement target circuit at a time of the measurement, such that it becomes impossible to carry out a high precision measurement.

On the other hand, there is another type of a conventional electric signal measurement apparatus using an electro-optic sampling, as disclosed in Japanese Patent Application Laid Open No. 5-72299 (1993) for example. In this type of a conventional electric signal measurement apparatus, a probe having an electro-optic material fixed therein is set in proximity to a signal line on which electric signals are propagated, to measure an electro-optic effect induced in the electro-optic material by a leakage electric field from that signal line, and thereby realizing a measurement of a potential at a signal line without a direct contact with a signal line.

In this type of a conventional electric signal measurement device, however, a leakage electric field strength changes depending on a distance between a signal line and an electro-optic material, so that there is a need to provide a large scale positioning device for positioning the electro-optic material with respect to the signal line in high precision.

SUMMARY OF THE INVENTION

It is therefore an object of the present invention to provide an electric signal measurement apparatus capable of measuring electric signals propagating on a signal line with only a lower disturbance, in a high precision over a wide bandwidth, and economically by a relatively compact apparatus size.

According to one aspect of the present invention there is provided an electric signal measurement apparatus for measuring measurement target electric signals propagating on a measurement target signal line, comprising: a conductor body to be set in one point contact with the measurement target signal line; an electro-optic material which changes a birefringence according to a strength of an electric field coupled by the conductor body, the electro-optic material having a first surface connected with the conductor body and a second surface facing against the first surface at which a potential is not affected by the electric field from the measurement target signal line and other signal lines; a laser source for irradiating a laser beam to the electro-optic material; and polarization detection means for detecting the laser beam with a polarization changed due to a change of the birefringence of the electro-optic material as an output indicative of the measurement target electric signals propagating on the measurement target signal line.

According to another aspect of the present invention there is provided an electric signal measurement apparatus for measuring measurement target electric signals propagating on a measurement target signal line, comprising: a probe head containing a conductor body to be set in contact with the measurement target signal line, and an electro-optic material which changes a birefringence according to a strength of an electric field coupled by the conductor body; a laser source for irradiating a laser beam to the electro-optic material; and a handy type probe body to which the probe head is attached, the probe body containing polarization detection means for detecting the laser beam with a polarization changed due to a change of the birefringence of the electro-optic material as an output indicative of the measurement target electric signals propagating on the measurement target signal line.

Other features and advantages of the present invention will become apparent from the following description taken in conjunction with the accompanying drawings.

BRIEF DESCRIPTION OF THE DRAWINGS

FIG. 2 is a schematic block diagram of a first embodiment of an electric signal measurement apparatus according to the present invention.

FIG. 5 is a schematic block diagram of one possible modification of the electric signal measurement apparatus of FIG. 2.

FIG. 13 is a block diagram of another possible modification of the electric signal measurement apparatus of FIG. 9.

DETAILED DESCRIPTION OF THE PREFERRED EMBODIMENTS

Figure 1:
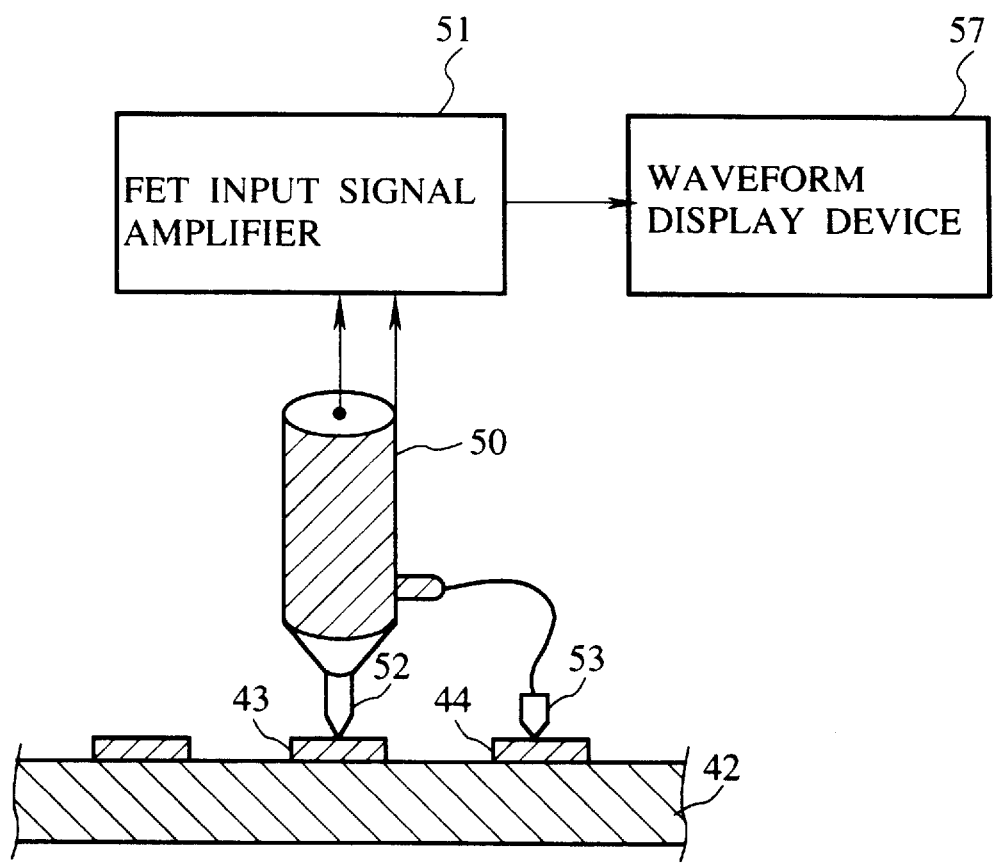
FIG. 1 is a schematic block diagram of a conventional FET probe.

Referring now to FIG. 2, a first embodiment of an electric signal measurement apparatus using the electro-optic sampling according to the present invention will be described in detail.

In this first embodiment, the electric signal measurement apparatus comprises a probe head 4, a laser source 5 for emitting a laser beam 40 toward the probe head 4, a polarization detector 6 for detecting a change of a polarization in the laser beam 40 reflected from the probe head 4, a signal processing device 35 for processing an output of the polarization detector 6 to obtain measured electric signals, and a waveform display device 7 for displaying a waveform of the measured electric signals obtained by the signal processing device 35.

The probe head 4 is formed by a cylindrical conductor body 1 to be set in one point contact with a signal line 43 of a measurement target circuit 42, a mirror 3 for reflecting the laser beam 40 emitted from the laser source 5, and an electro-optic material 2, electrically connected with the conductor body 1 through the mirror 3, for changing its birefringence depending on the strength of the electric field coupled from the conductor body 1. Here, the conductor body 1 is manufactured to have a conically tapering tip end for enabling a contact even with the signal line 43 having a very thin signal line width. The electro-optic material 2 is made of a material sensitive to an electric field in a direction parallel to a propagating direction of the laser beam, such as $BSO(Bi_{12}SiO_{20})$, CdTe, GaAs, $LN(LiNbO_3)$–55° cut, ZnTe, KD.P, CuCl, ZnS, and KTP–Z cut.

Figure 3A:
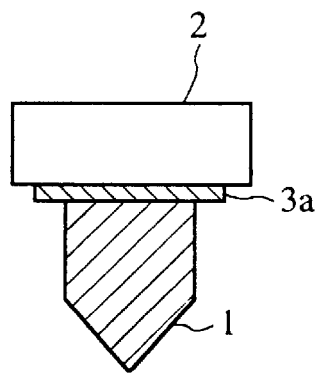
FIGS. 3A, 3B, and 3C are schematic side views of a probe head in the electric signal measurement apparatus of FIG. 2, illustrating three different types of a mirror configuration in the probe head.
Figure 3B:
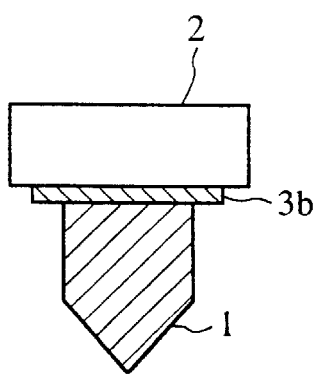
Figure 3C:
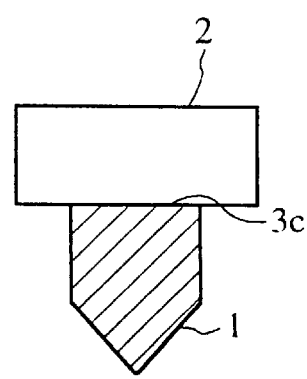

The mirror 3 can be any of a metal mirror 3a shown in FIG. 3A which is formed on a lower surface of the electro-optic material 2 by the vapor deposition of a metal, a dielectric multi-layer film mirror 3b shown in FIG. 3B which is formed on a lower surface of the electro-optic material 2 by the vapor deposition of a dielectric multi-layer film, or a surface polished mirror 3c shown in FIG. 3C which is formed by surface polishing an upper surface of the conductor body 1.

In a case of using the metal mirror 3a as shown in FIG. 3A, it is possible to reflect the incident laser beam 40 completely by providing the metal mirror 3a with a sufficiently large area compared with an upper surface of the conductor body 1. Namely, when the conductor body 1 is made thinner in order to reduce its capacity, an area of the mirror 3 also becomes small in a case of the surface polished mirror 3c of FIG. 3C so that it becomes difficult to reflect the incident laser beam 40 completely, but this problem does not arise in this metal mirror 3a of FIG. 3A. In addition, the reflection is not affected even when the upper surface of the conductor body 1 is rough in this case. Moreover, the conductor body 1 and the metal mirror 3a can be formed by different metals in this case, and a wide range of choices for the metals are available. For instances, a metal with a high reflectivity such as gold, silver, and platinum can be used for the metal mirror 3a, while a metal with a low resistivity such as phosphor bronze can be used for the conductor body 1.

In a case of using the dielectric multi-layer film mirror 3b as shown in FIG. 3B, the following effect can be expected. Namely, in general, the electric field entering into the electro-optic material 2 is nearly proportional to an area of a contacting surface of the conductor body 1, and when this area of the contacting surface of the conductor body 1 has a large dimension with respect to the thickness of the electro-optic material 2, the electric field can come out from an upper surface of the electro-optic material 2 such that a potential at the upper surface of the electro-optic material 2 does not become zero. In such a state, it becomes easier for the electro-optic sampling to receive an influence of the electric fields from the signal lines other than the measurement target signal line, and it becomes impossible to carry out an absolute value measurement. In this regard, in a case of using the metal mirror 3a of FIG. 3A, the electric field is generated from a whole of the metal mirror 3a such that it becomes easier for the electric field to come out from the upper surface of the electro-optic material 2. In order to prevent this situation, the dielectric multi-layer film mirror 3b of FIG. 3B can be used to localize the electric field generation source to be a small one at a center of the lower surface of the electro-optic material 2, while enlarging an area of the mirror.

In a case of using the surface polished mirror 3c as shown in FIG. 3C, there is an advantage that a structure of the probe head 4 is the simplest among three types of mirror configuration shown in FIGS. 3A, 3B, and 3C.

The laser source 5 irradiates the pulsed laser beam to the electro-optic material 2. Here, in a case a required measurement bandwidth is not so high, for example less than or equal to 1 GHz to be specific, it is also possible to use a laser source for generating the CW (Continuous Wave) beam in order to simplify the system configuration.

It is to be noted here that, as described in detail in the subsequent embodiments, the polarization detector 6 comprises optical elements such as a polarizing beam splitter, a Faraday rotator, a wave plate, a photo-detector, etc.

In the configuration of FIG. 2, the conductor body 1 is set in one point contact with the signal line 43 to put the conductor body 1 at the same potential as the signal line 43, and the electric field 41 due to the measurement target electric signals propagating on the signal line 43 leaks from the conductor body 1 such that this electric field 41 is coupled to the electro-optic material 2. When the laser beam 40 is entered into the electro-optic material 2 in this state, the polarization of the laser beam 40 is changed due to the change of the birefringence of the electro-optic material 2 caused by the electric field 41 coupled to the electro-optic material 2. This change of a polarization in the laser beam 40 reflected from the probe head 4 is detected by the polarization detector 6 as an output indicative of electric signal strength change, and this output of the polarization detector 6 is processed by the signal processing device 35 to obtain measured electric signals, such that the waveform display device 7 displays a waveform of the measured electric signals obtained by the signal processing device 35.

Here, a form of the electric field 41 coupled to the electro-optic material 2 is determined by the materials and shapes of the conductor body 1, the electro-optic material 2, and the mirror 3 which constitute the probe head 4, and by providing a sufficient thickness between the upper surface and the lower surface of the electro-optic material 2 to prevent the electric field 41 from reaching to the upper surface of the electro-optic material 2, it is possible to eliminate an influence of the electric fields from the signal lines in a vicinity of the measurement target signal line and it becomes possible to regard the potential at the upper surface of the electro-optic material 2 as effectively zero, while the lower surface of the electro-optic material 2 is effectively at the same potential as the signal line 43, so that it becomes possible for this electric signal measurement apparatus of FIG. 2 to carry out an absolute value measurement by one point contact, without any dependency on a shape of the measurement target signal line.

In more general expression, the electro-optic material in the electric signal measurement apparatus of the present invention has a first surface connected with the conductor body and a second surface facing against the first surface at which a potential is not affected by the electric field from the measurement target signal line and other signal lines.

To be specific, a diameter of the conductor body 1 is set to be 0.5 mm and a height of the conductor body 1 is set to be 4 mm when the measurement target electric signals are 10 GHz, and a diameter of the conductor body 1 is set to be 2 mm and a height of the conductor body 1 is set to be 8.5 mm when the measurement target electric signals are 5.5 GHz, for example, and in either case it is preferable to set a thickness of the electro-optic material 2 to be greater than or equal to 5 mm which is sufficiently thick compared with the diameter of the conductor body 1.

In addition, in this electric signal measurement apparatus of FIG. 2, it is possible to carry out a calibration of a voltage axis by measuring a known electric signal using an appropriate signal line in advance, obtaining and storing a correction factor from a relationship between a known voltage of the known electric signal and the signal strength actually detected by this electric signal measurement apparatus, and correcting the signal strength detected by this electric signal measurement apparatus according to the stored correction factor in the actual measurement of the measurement target electric signals.

Figure 4:
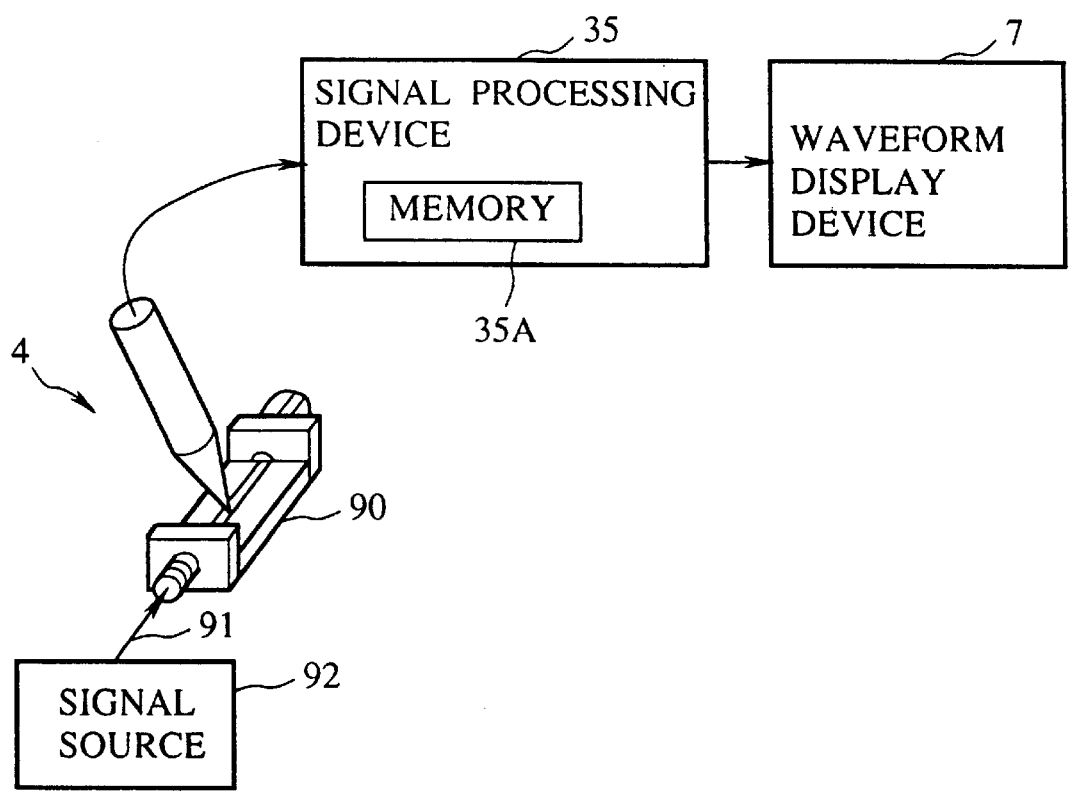
FIG. 4 is a schematic block diagram of a configuration for carrying out a voltage axis calibration in the electric signal measurement apparatus of FIG. 2

More specifically, as shown in FIG. 4, an electric signal 91 having a known voltage is applied from a prescribed signal source 92 to a prescribed reference wiring 90, and the probe head 4 of this electric signal measurement apparatus is set in one point contact with this reference wiring 90 to carry out the measurement. Then, the correction factor is obtained by the signal processing device 35 from a relationship of the detected signal strength and the known voltage of the electric signal 91, and the obtained correction factor is stored in a memory 35A provided within the signal processing device 35. Thereafter, in the actual measurement of the measurement target electric signals, the detected signal strength is multiplied by the correction factor stored in the memory 35A before the display of the waveform by the waveform display device 7.

It is to be noted here that the reference wiring 90 and the signal source 92 may be provided as a part of an apparatus body of this electric signal measurement apparatus so as to facilitate the calibration of the voltage axis in this electric signal measurement apparatus by itself.

It is also to be noted that the reference wiring 90 may be replaced by a metal pin, in a case the electric signal 91 with the known voltage has a low frequency, such as about 10 MHz for example.

FIG. 5 shows one exemplary modification of the electric signal measurement apparatus of FIG. 2, which is provided with a insulative fixing member 60 for fixing (or fixedly holding) the electro-optic material 2 with respect to the laser source 5 and the polarization detector 6.

In this configuration of FIG. 5, it is possible to fix the positional relationship of the electro-optic material 2 with respect to the laser source 5 and the polarization detector 6 so that by carrying out an optical axis adjustment for the laser beam 40 once in an early stage of the apparatus assembling process, there is no need to adjust the optical axis of the laser beam 40 thereafter, and consequently there is no need to provide an optical system adjustment mechanism within the apparatus, so that it becomes possible to make this electric signal measurement apparatus very compact.

Figure 6A:
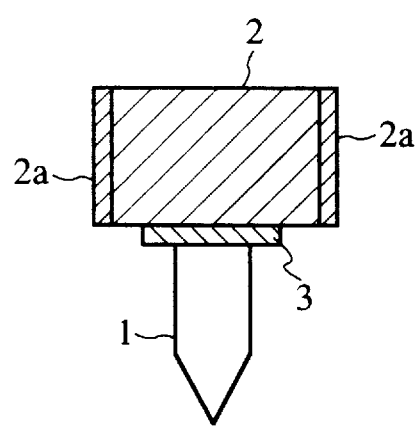
FIGS. 6A and 6B are schematic side views of a probe head in the electric signal measurement apparatus of FIG. 2, illustrating two alternative configurations for an electro-optic material.
Figure 6B:
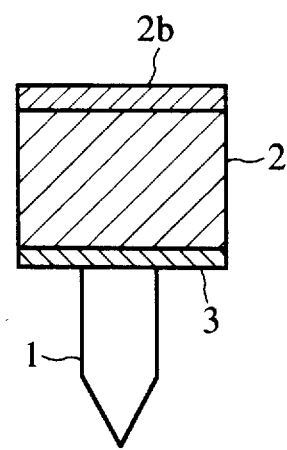

FIGS. 6A and 6B show two alternative configurations for the electro-optic material 2, of which FIG. 6A is a case where electrodes 2a which are electrically insulated and separated from the conductor body 1 and at a fixed potential unrelated with a potential of the conductor body 1 are provided on two mutually opposite side surfaces of the electro-optic material 2, while FIG. 6B is a case where a transparent electrode 2b which is electrically insulated and separated from the conductor body 1 and at a fixed potential unrelated with a potential of the conductor body 1 is provided on the upper surface of the electro-optic material 2.

When the electrodes 2a are provided on the side surfaces of the electro-optic material 2 as shown in FIG. 6A, it becomes possible to prevent the electric field from coming out of the upper surface of the electro-optic material 2 as it is possible to draw the electric field entering into the electro-optic material 2 toward the electrodes 2a by appropriately selecting the potential of these electrodes 2a. On the other hand, when the transparent electrode 2b is provided on the upper surface of the electro-optic material 2 as shown in FIG. 6B, it also becomes possible to prevent the electric field from coming out of the upper surface of the electro-optic material 2, without affecting the transmission of the laser beam from the upper surface of the electro-optic material 2. It is to be noted that each of these alternative configurations for the electro-optic material 2 as shown in FIGS. 6A and 6B may be combined with any of the mirror configurations shown in FIGS. 3A, 3B, and 3C described above.

FIGS. 7A to 7D show exemplary configurations of the probe head 4 in a case of using an electro-optic material 2' which is made of a material sensitive to an electric field in a direction perpendicular to a propagating direction of the laser beam, such as LT(LiTaO₃), LN(LiNbO₃), KTP, DAST, and AANP, instead of the electro-optic material 2 described above.

Figure 7A:
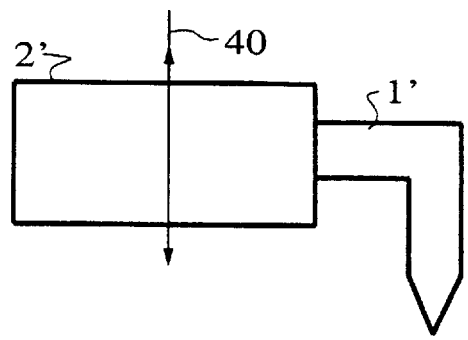
FIGS. 7A, 7B, 7C, and 7D are schematic side views of a probe head in the electric signal measurement apparatus of FIG. 2, illustrating four possible configurations of the probe head in a case of using a different type of an electro-optic material.
Figure 7B:
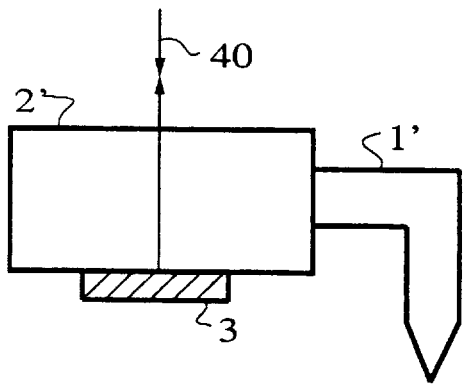
Figure 7C:
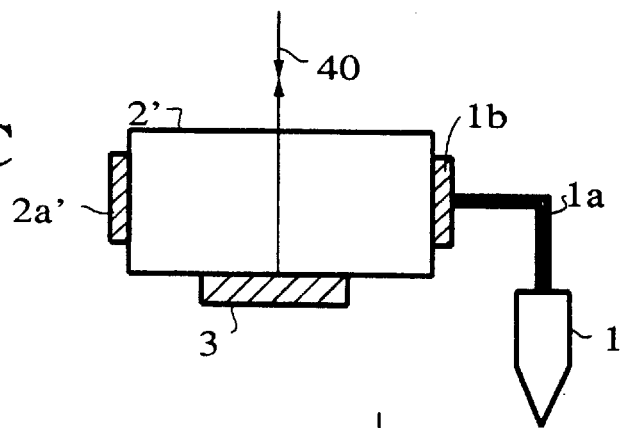
Figure 7D:
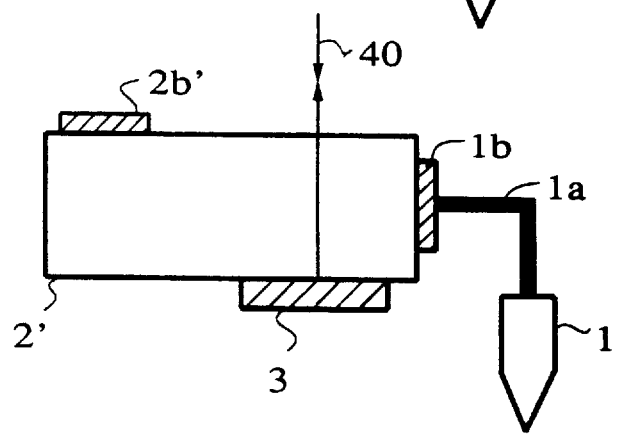

FIG. 7A shows a case in which a conductor body 1' having a right angle bent portion is directly connected to one side surface of the electro-optic material 2'. FIG. 7B shows a case in which the mirror 3 for reflecting the laser beam 40 is added to a lower surface of the electro-optic material 2' in the configuration of FIG. 7A. FIG. 7C shows a case in which the conductor body 1 is connected to one side surface of the electro-optic material 2' through an electrode 1b and a conductive wire 1a having a right angle bent portion, while an electrode 2a' which is electrically insulated and separated from the conductor body 1 is added to another side surface of the electro-optic material 2' which is facing against the one side surface to which the conductor body 1 is connected. FIG. 7D shows a case in which an electrode 2b' which is electrically insulated and separated from the conductor body 1 is added to a surface of the electro-optic material 2' other than the another side surface facing against the one side surface (an upper surface in FIG. 7D for example) instead of the electrode 2a' in the configuration of FIG. 7C.

It is to be noted here that, in a case of using the electro-optic material 2' described above, the mirror 3 should be the dielectric multi-layer film mirror as shown in FIG. 3B described above.

As described, according to this first embodiment, it is possible to provide an electric signal measurement apparatus using the electro-optic sampling by one point contact, which is capable of measuring electric signals propagating on a signal line with only a lower disturbance, in a high precision over a wide bandwidth, and economically by a relatively compact apparatus size.

Figure 8:
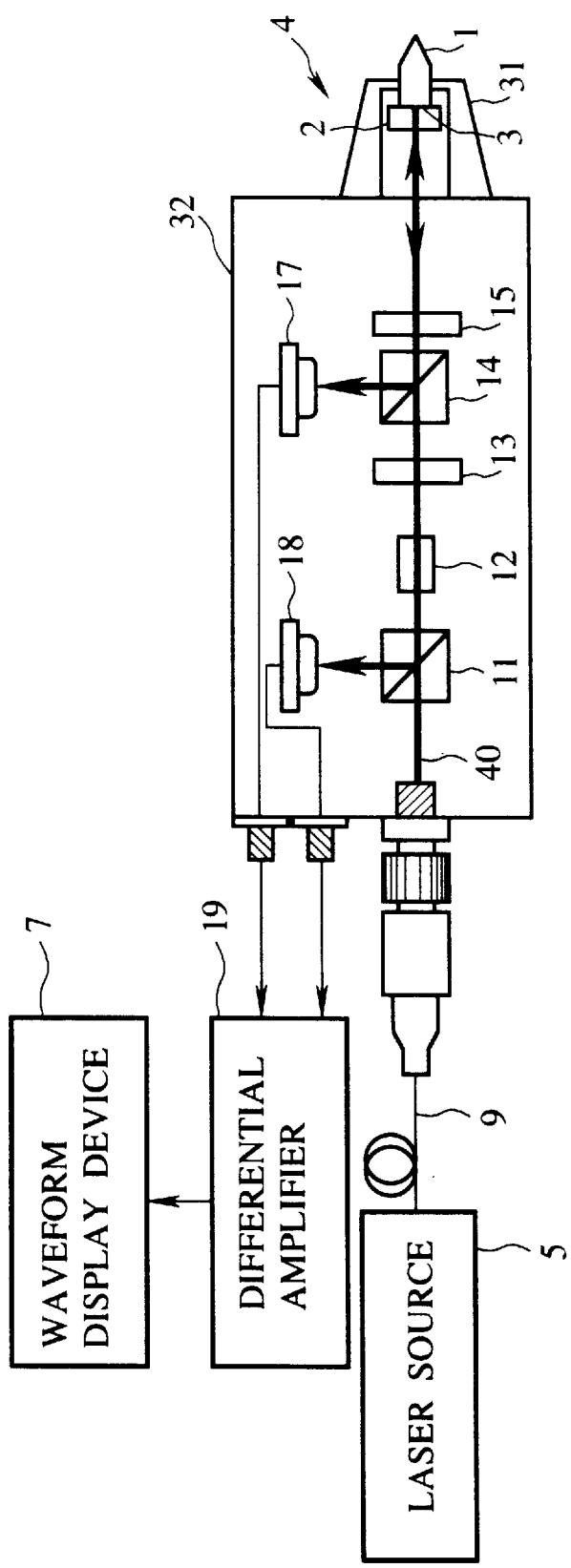
FIG. 8 is a block diagram of a second embodiment of an electric signal measurement apparatus according to the present invention.

Referring now to FIG. 8, a second embodiment of an electric signal measurement apparatus using the electro-optic sampling according to the present invention will be described in detail. This second embodiment concerns with a realization of a handy type probe body integrally incorporating the probe head 4 and the polarization detector 6 of the first embodiment of FIG. 2 described above.

In this second embodiment, the electric signal measurement apparatus comprises: a handy type probe body 32 incorporating optical elements functioning as the polarization detector 6 of the first-embodiment as will be described in detail below; the probe head 4 formed by the conductor body 1, the electro-optic material 2, and the mirror 3, which are attached to a head portion of the probe body 32 by means of an insulative holder 31; the laser source 5 for emitting a laser beam 40 to be entered into the probe body 32 by a polarization maintaining fiber 9; a differential amplifier 19 for obtaining the measured electric signals according to the outputs from the probe body 32; and the waveform display device 7 for displaying a waveform of the measured electric signals obtained by the differential amplifier 19. In FIG. 8, bold arrow lines represent paths of the laser beam 40, while thin arrow lines represents paths of the electric signals.

In this configuration of FIG. 8, when the suitable linearly polarized laser beam 40 is emitted by the laser source 5 into the polarization maintaining fiber 9, the polarization maintaining fiber 9 can enter the laser beam 40 into the probe body 32 by maintaining its linear polarization state even when the external disturbance such as twisting is exerted onto a fiber section, so that the measurement condition is unchanged even when the measurement is carried out by inclining the probe body 32 in arbitrary angle.

The probe body 32 contains a first polarizing beam splitter 11, a Faraday rotator 12, a first wave plate 13, a second polarizing beam splitter 14, and a second wave plate 15, which are arranged in this order from the polarization maintaining fiber 9 side to the probe head 4 side, and a first photo-detector 17 and a second photo-detector 18 which receive laser beams split by the second polarizing beam splitter 14 and the first polarizing beam splitter 11, respectively, and generates the outputs to be supplied to the differential amplifier 19.

In this probe body 32, the laser beam 40 entering into the first polarizing beam splitter 11 is split into the polarization component parallel to a plane of this drawing which is passed through and the polarization component perpendicular to a plane of this drawing which is deflected by 90° and entered into the second photo-detector 18. Also, the laser beam 40 entering into the Faraday rotator 12 has its polarization rotated for 45°, while the laser beam 40 entering into the first wave plate 13 has its polarization returned as much as it is rotated by the Faraday rotator 12, i.e., for 45°. By forming such an optical system, it is possible to obtain the laser beam 40 reflected from the probe head 4 separately from the incident beam as the mutually orthogonal polarization components at the first polarizing beam splitter 11 and the second polarizing beam splitter 14. The separated polarization components are subsequently converted into the electric signals by the first photo-detector 17 and the second photo-detector 18 and outputted from the probe body 32 to the differential amplifier 19.

Also, in the probe body 32, the second wave plate 15 is equipped with a mechanism (not shown) for making this second wave plate 15 to be rotatable around the optical axis of the laser beam 40, in order to carry out an adjustment for balancing intensities of two separated laser beam components entering into the first and second photo-detectors 17 and 18 while enlarging S/N, so as to adjust the S/N of the detected electric signal.

The differential amplifier 19 detects the reverse phase signal component as the measured electric signal while removing the in phase signal components as noise, and the measured electric signal detected by this differential amplifier 19 is then entered into the waveform display device 7 for displaying the waveform of the measured electric signal.

Thus, in this second embodiment, the polarization detection optics are provided in forms of compact modules within the handy type probe body 32, such that the measurement of the electric signals can be carried out easily even under a constrained measurement environment as in a case of a measurement of a packaging board or a printed circuit board already installed in a circuit device.

Figure 9:
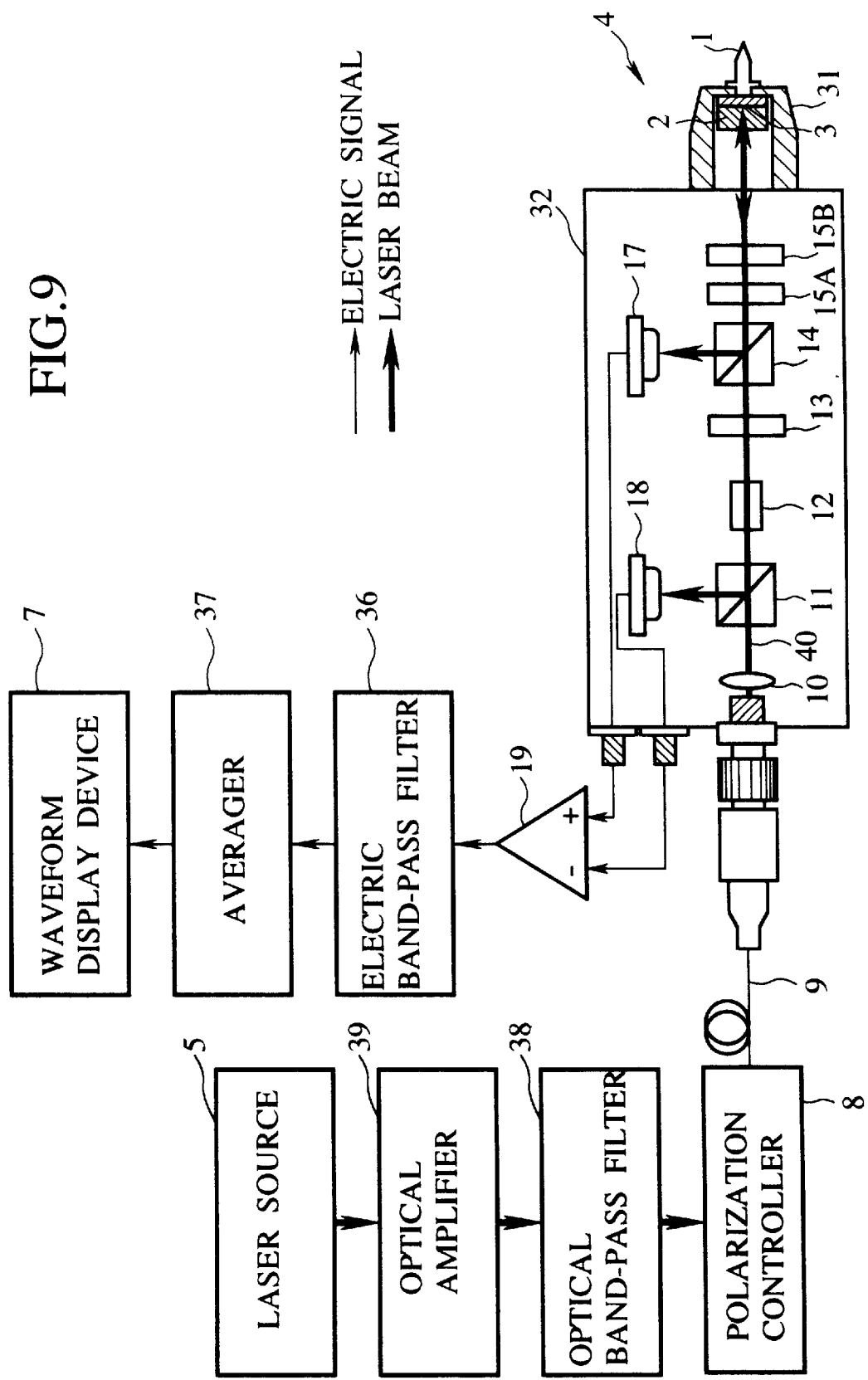
FIG. 9 is a block diagram of a third embodiment of an electric signal measurement apparatus according to the present invention.

Referring now to FIG. 9, a third embodiment of an electric signal measurement apparatus using the electro-optic sampling according to the present invention will be described in detail. This third embodiment concerns with a more concrete realization of the apparatus having a handy type probe body as in the second embodiment of FIG. 8 described above.

In this third embodiment, the electric signal measurement apparatus has the handy type probe body 32 incorporating optical elements functioning as the polarization detector 6 of the first embodiment as will be described in detail below, and the probe head 4 formed by the conductor body 1, the electro-optic material 2, and the mirror 3, which are attached to a head portion of the probe body 32 by means of the insulative holder 31.

The electric signal measurement apparatus of FIG. 9 further includes the laser source 5, an optical amplifier 39, an optical band-pass filter 38, a polarization controller 8, and the polarization maintaining fiber 9 connected to an input side of the prove body 32, and the differential amplifier 19, an electric band-pass filter 36, an averager 37, and the waveform display device 7 connected to an output side of the probe body 32.

In this configuration of FIG. 9, when the power of the laser beam 40 outputted from the laser source 5 is low, the laser beam 40 is amplified by the optical amplifier 39, and the noise component superposed at the optical amplifier 39 is removed by the optical band-pass filter 38. It is to be noted here that the optical amplifier 39 and the optical band-pass filter 38 may be omitted when the power of the laser beam 40 outputted from the laser source 5 is sufficiently high.

The polarization controller 8 linearly polarizes the laser beam 40 outputted from the optical band-pass filter 38, and enters the linearly polarized laser beam into the polarization maintaining fiber 9. This polarization controller 8 adjusts the direction of the polarization of the laser beam 40 such that the polarization of the laser beam 40 can be maintained by the polarization maintaining fiber 9. When the suitable linearly polarized laser beam 40 is entered from the polarization controller 8 into the polarization maintaining fiber 9, the polarization maintaining fiber 9 can enter the laser beam 40 into the probe body 32 by maintaining its linear polarization state even when the external disturbance such as twisting is exerted onto a fiber section, so that the measurement condition is unchanged even when the measurement is carried out by inclining the probe body 32 in arbitrary angle.

The probe body 32 contains a collimate lens 10, a first polarizing beam splitter 11, a Faraday rotator 12, a first half wave plate 13, a second polarizing beam splitter 14, a quarter wave plate 15A, and a second half wave plate 15B, which are arranged in this order from the polarization maintaining fiber 9 side to the probe head 4 side, and a first photo-detector 17 and a second photo-detector 18 which receive laser beams split by the second polarizing beam splitter 14 and the first polarizing beam splitter 11, respectively, and generates the outputs to be supplied to the differential amplifier 19.

In this probe body 32, the laser beam 40 entered from the polarization maintaining fiber 9 is collimated by the collimate lens 10. The laser beam 40 entering into the first polarizing beam splitter 11 is-split into the polarization component parallel to a plane of this drawing which is passed through and the polarization component perpendicular to a plane of this drawing which is deflected by 90° and entered into the second photo-detector 18. Also, the laser beam 40 entering into the Faraday rotator 12 has its polarization rotated for 45°, while the laser beam 40 entering into the first wave plate 13 has its polarization returned as much as it is rotated by the Faraday rotator 12, i.e., for 45°. By forming such an optical system, it is possible to obtain the laser beam 40 reflected from the probe head 4 separately from the incident beam as the mutually orthogonal polarization components at the first polarizing beam splitter 11 and the second polarizing beam splitter 14. The separated polarization components are subsequently converted into the electric signals by the first photo-detector 17 and the second photo-detector 18 and outputted from the probe body 32 to the differential amplifier 19.

Also, in the probe body 32, the quarter wave plate 15A and the second half wave plate 15B are equipped with a mechanism (not shown) for making these quarter wave plate 15A and second half wave plate 15B to be rotatable around the optical axis of the laser beam 40, in order to carry out an adjustment for balancing intensities of two separated laser beam components entering into the first and second photo-detectors 17 and 18 while enlarging S/N, so as to adjust the S/N of the detected electric signal.

The differential amplifier 19 detects the reverse phase signal component as the measured electric signal while removing the in phase signal components as noise. The output of the differential amplifier 19 is then passed through the electric band-pass filter 36 for extracting only those frequency components which are contained in the measurement target electric signals and the averager 37 for taking an average of its inputs over a prescribed period of time, and then entered into the waveform display device 7 for displaying the waveform of the measured electric signal.

Thus, in this third embodiment, the polarization detection optics are provided in forms of compact modules within the handy type probe body 32, such that the measurement of the electric signals can be carried out easily even under a constrained measurement environment such as that in a case of a measurement of a packaging board or a printed circuit board already installed in a circuit device, just as in the second embodiment described above.

Figure 10:
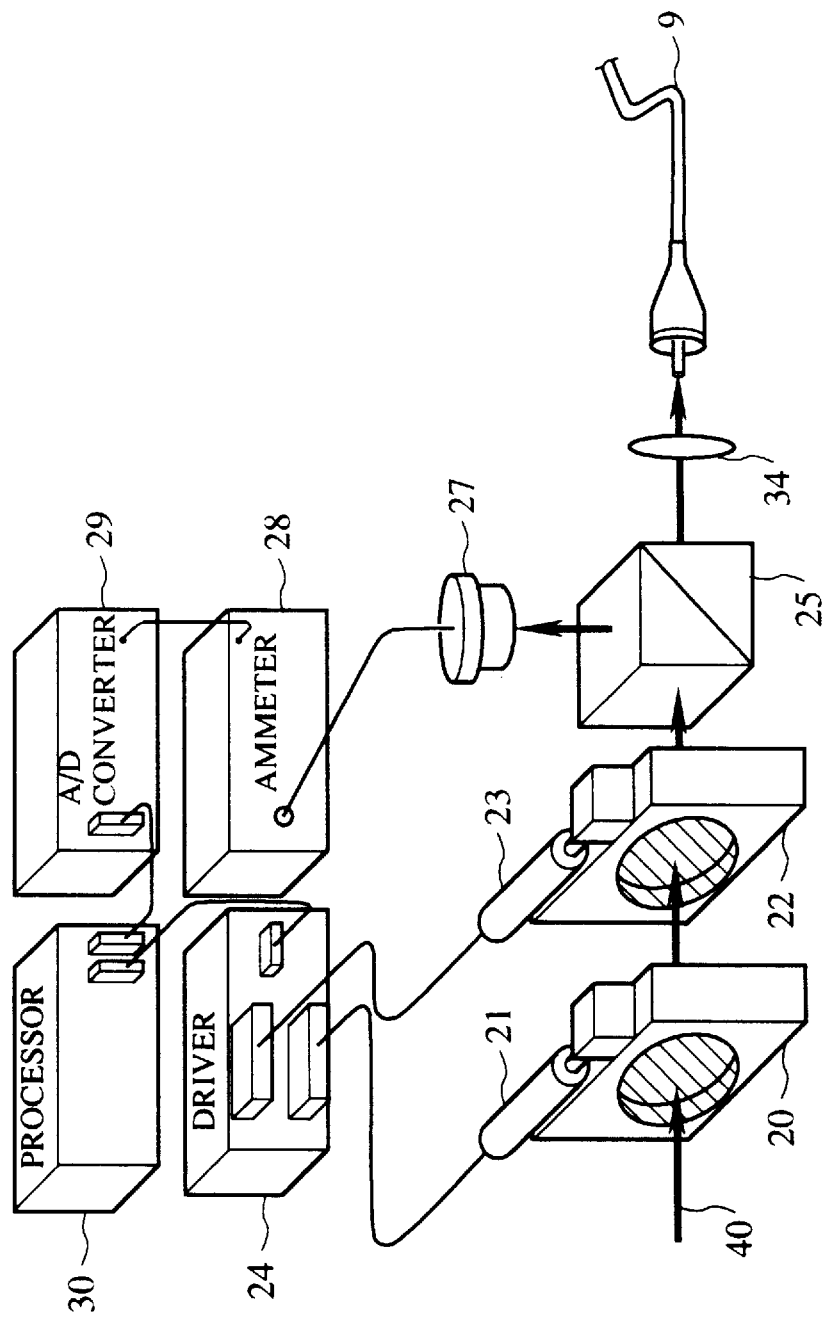
FIG. 10 is a block diagram of one configuration for a polarization controller in the electric signal measurement apparatus of FIG. 9.

The polarization controller 8 has an exemplary configuration as shown in FIG. 10, which includes a quarter wave plate 20 and a half wave plate 22 made to be rotatable around the optical axis of the entering laser beam 40 by a first rotation mechanism 21 and a second rotation mechanism 23, respectively, such that the polarization state of the laser beam 40 can be adjusted freely by the rotations of the quarter wave plate 20 and the half wave plate 22. The laser beam 40 passing through the quarter wave plate 20 and the half wave plate 22 is then entered into a polarizer 25 which outputs mutually orthogonal linearly polarized laser beams. One of the outputs of the polarizer 25 is then entered into a photo-detector 27, while the other one of the outputs of the polarizer 25 is collimated by a collimate lens 34 and entered into the polarization maintaining fiber 9.

The amount of laser beam received by the photo-detector 27 is measured by an ammeter 28 as an electric current, and a value measured by the ammeter 28 is converted into digital data by an A/D converter 29 and given to a processor 30. The processor 30 issues commands for controlling an operation of a driver 24 which drives the first rotation mechanism 21 and the second rotation mechanism 23 such that the rotations of the quarter wave plate 20 and the half wave plate 22 are adjusted to minimize the amount of laser beam received by the photo-detector 27, i.e., the electric current measured by the ammeter 28. With this configuration, it becomes always possible to enter the linearly polarized laser beam into the polarization maintaining fiber 9 efficiently.

In this polarization controller 8, the direction of the polarization of the linearly polarized laser beam 40 is adjusted such that the polarization of the laser beam 40 coincides with the polarization maintaining direction of the polarization maintaining fiber 9.

It is also possible to modify this configuration of FIG. 10 such that, instead of receiving the laser beam outputted from the polarizer 25 by the photo-detector 27, a beam splitter is provided between the polarizer 25 and the collimate lens 34 such that a part of the laser beam entering into the polarization maintaining fiber 9 is extracted and lead to the photo-detector 27 by this beam splitter, and the processor 30 controls the driver 24 such that the rotations of the quarter wave plate 20 and the half wave plate 22 are adjusted to maximize the amount of laser beam received by the photo-detector 27, i.e., the electric current measured by the ammeter 28.

Figure 11:
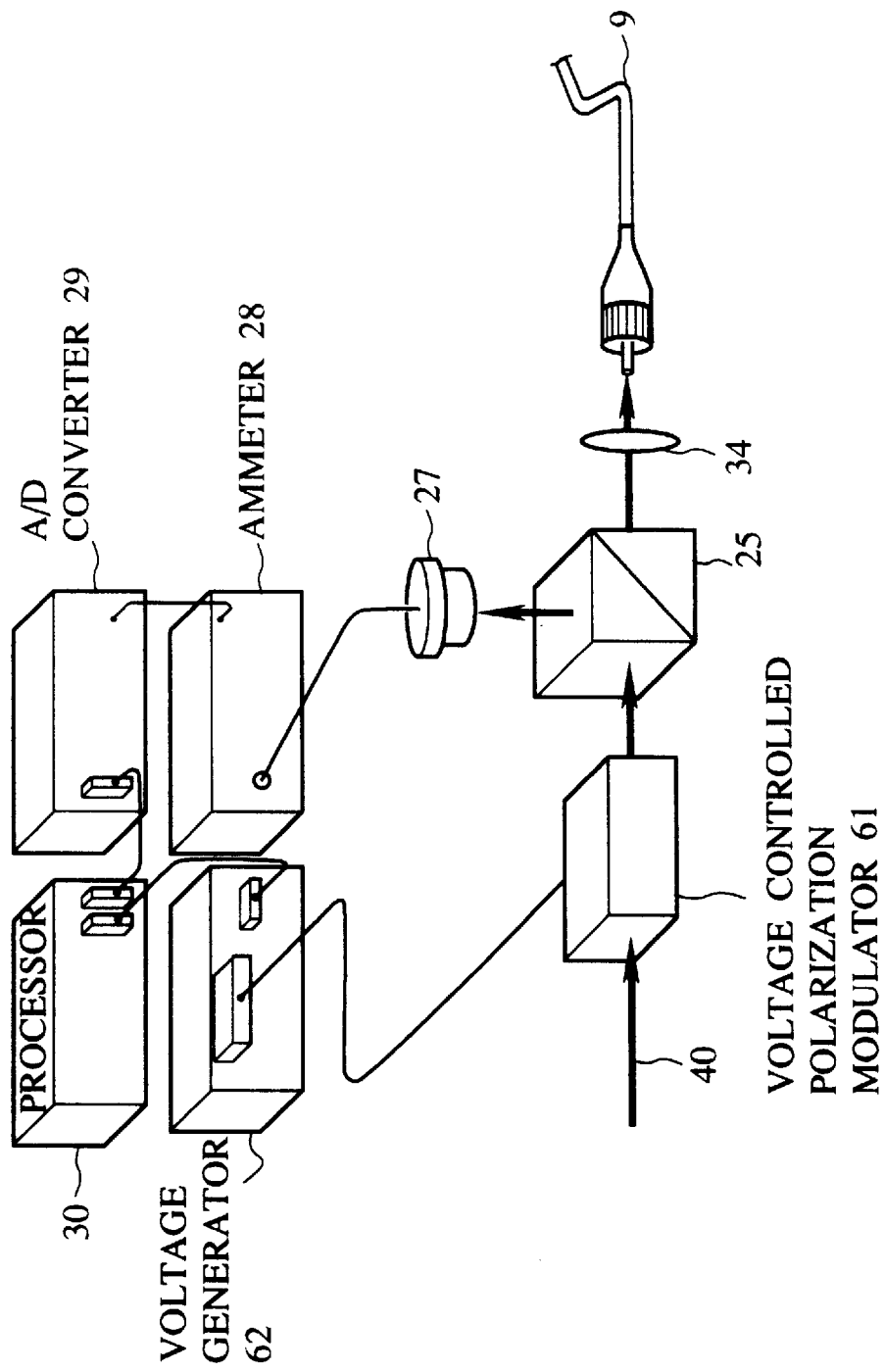
FIG. 11 is a block diagram of another configuration for a polarization controller in the electric signal measurement apparatus of FIG. 9.

It is also possible to modify this configuration of FIG. 10 such that, instead of using the quarter wave plate 20 and the half wave plate 22 equipped with the first rotation mechanism 21 and the second rotation mechanism 23 driven by the driver 24, a polarization modulator for changing the polarization of the laser beam which is controllable by a voltage supplied from a voltage generator under the control of the processor 30 may be used. Namely, it is possible to adopt a configuration as shown in FIG. 11, in which the quarter wave plate 20 and the half wave plate 22 equipped with the first rotation mechanism 21 and the second rotation mechanism 23 in FIG. 10 are replaced by a voltage controlled polarization modulator 61, while the driver 24 in FIG. 10 is replaced by a voltage generator 62 controlled by the processor 30.

Figure 12:
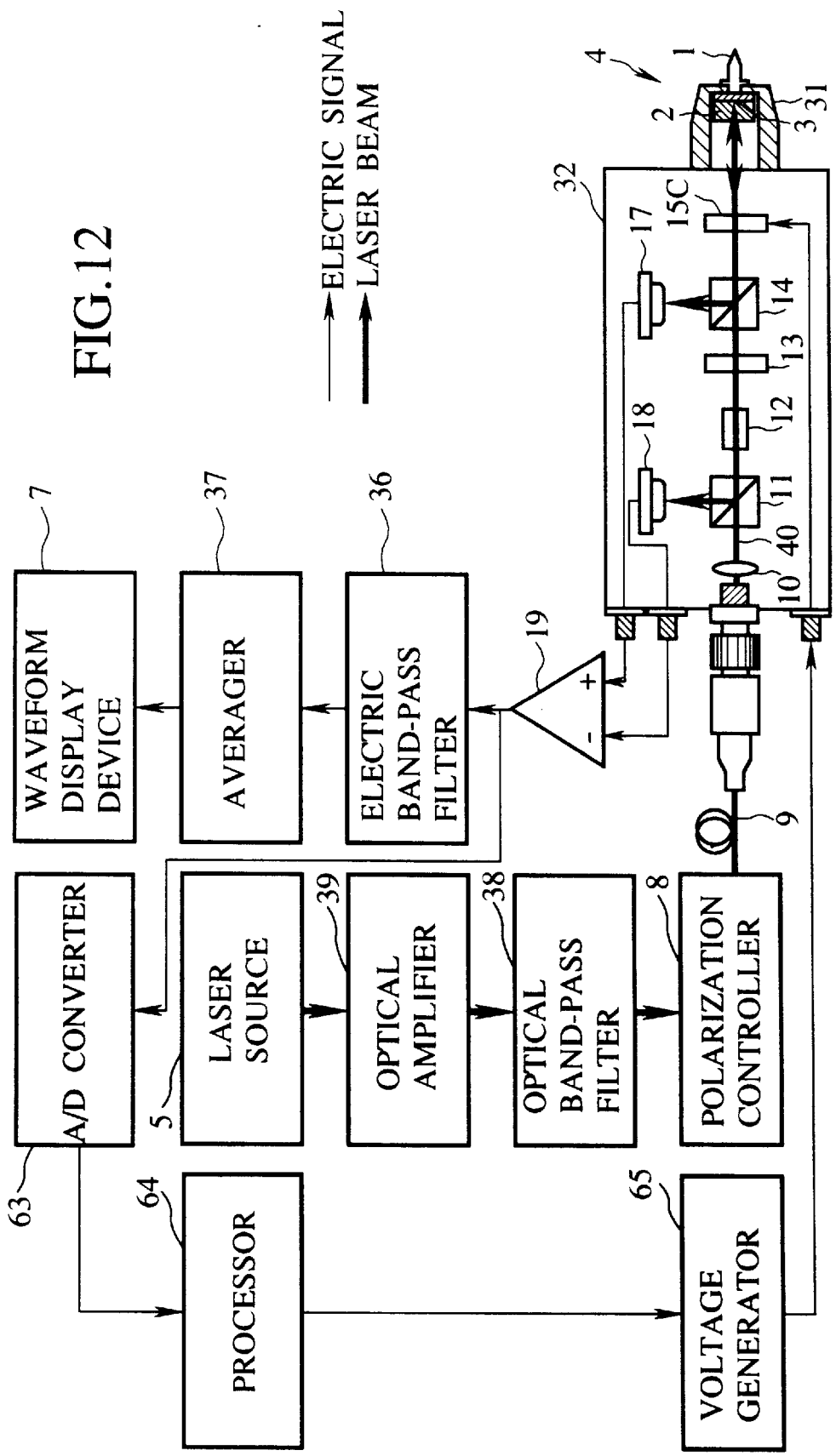
FIG. 12 is a block diagram of one possible modification of the electric signal measurement apparatus of FIG. 9.

It is also possible to modify the configuration of FIG. 9 as in FIG. 12 such that the quarter wave plate 15A and the second half wave plate 15B in FIG. 9 are replaced by a voltage controlled polarization modulator 15C, while an A/D converter 63, a processor 64, and a voltage generator 65 are provided between an output of the differential amplifier 19 and this voltage controlled polarization modulator 15C.

In this case, it is possible to detect a deviation of the balance between the laser beam intensities reaching to the first photo-detector 17 and the second photo-detector 18 from the output of the differential amplifier 19, so that there is provided a feedback system in which this deviation is A/D converted by the A/D converter 63 and given to the processor 64, and the processor 64 controls the voltage generator 65 such that the voltage controlled polarization modulator 15C is controlled by the voltage for correcting this deviation. By means of this feedback system, it is possible to adjust the voltage controlled polarization modulator 15C quickly into a state for realizing satisfactory S/N.

It is also possible to modify the configuration of FIG. 9 as in FIG. 13 such that the laser source 5, the optical amplifier 39, the optical band-pass filter 38, the polarization controller 8, and the polarization maintaining fiber 9 in FIG. 9 are replaced by a laser diode 71 which is provided within the probe body 32 in front of the polarization detection optics, and a laser driver 72 for generating electric signals to drive the laser diode 71 which is provided outside the probe body 32. In this case, from a point of view of the outside of the probe body 32, this probe body 32 is in a configuration for receiving inputs in forms of electric signals and obtaining outputs in forms of electric signals.

FIGS. 14A to 14D show various configurations of the probe head 4 and the insulative holder 31 applicable to the electric signal measurement apparatus of FIG. 9, which incorporate a shock absorption mechanism for absorbing a shock caused when the conductor body 1 makes contact with the signal line, so as to protect the electro-optic material 2 and the mirror 3 from the shock.

Figure 14A:
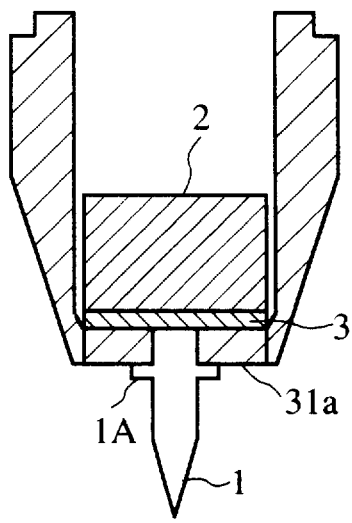
FIGS. 14A, 14B, 14C, and 14D are schematic side views of a probe head in the electric signal measurement apparatus of FIG. 9, illustrating four different types of a shock absorption mechanism in the probe head.

FIG. 14A shows a configuration in which the conductor body 1 has a stopper 1A in a form of a protruded portion formed on its side surface, which is abutted to the insulative holder 31a, such that the shock caused when the conductor body 1 makes contact with the signal line is received by the entire insulative holder 31a through the stopper 1A so as to effectively reduce the shock given to the electro-optic material 2.

Figure 14B:
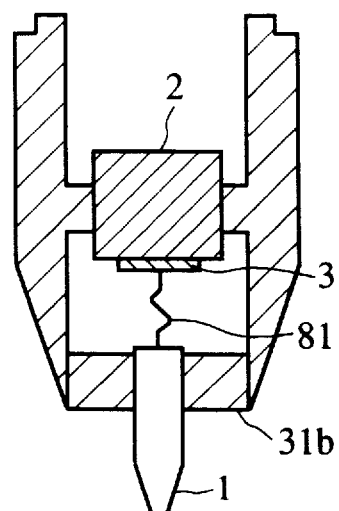

FIG. 14B shows a configuration in which the conductor body 1 is supported separately from the electro-optic material 2 and the mirror 3 by the insulative holder 31b while a conductive and elastic wire 81 is provided between the conductor body 1 and the mirror 3 on the lower surface of the electro-optic material 2, such that the shock caused when the conductor body 1 makes contact with the signal line is absorbed by the bending of the wire 81 so as to effectively reduce the shock given to the electro-optic material 2.

Figure 14C:
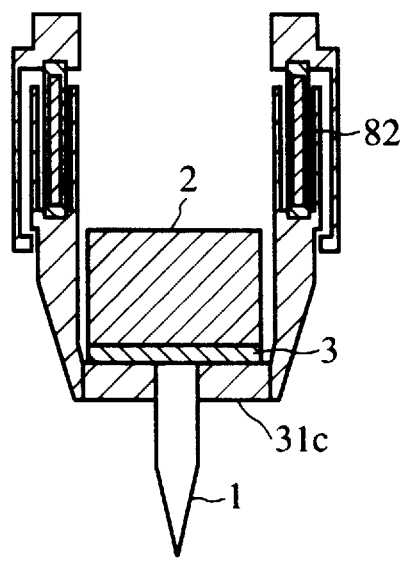

FIG. 14C shows a configuration in which the conductor body 1 is elastically supported by the insulative holder 31c which incorporates an elastic member 82 such as a spring having a degree of freedom only in a direction of the optical axis of the laser beam, such that the shock caused when the conductor body 1 makes contact with the signal line is absorbed by the elasticity of the elastic member 82 so as to effectively reduce the shock given to the electro-optic material 2.

Figure 14D:
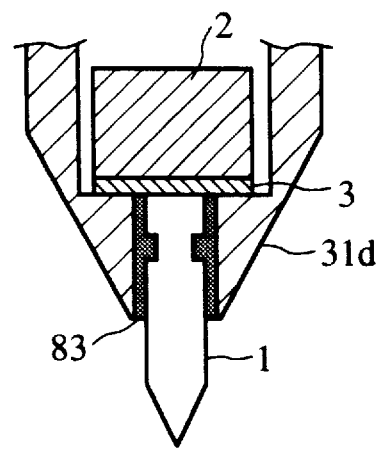

FIG. 14D shows a configuration in which the conductor body has a groove portion on its side surface, and this conductor body 1 is tightly fixed to the insulative holder 31d by means of adhesive 83 applied at the side surface of the conductor body 1 including the groove portion, such that the shock caused when the conductor body 1 makes contact with the signal line is received by the entire insulative holder 31d so as to effectively reduce the shock given to the electro-optic material 2, just as in a case of FIG. 14A.

It is to be noted here that, besides those already mentioned above, many modifications and variations of the above embodiments may be made without departing from the novel and advantageous features of the present invention. Accordingly, all such modifications and variations are intended to be included within the scope of the appended claims.

What is claimed is:

1. An electric signal measurement apparatus for measuring measurement target electric signals propagating on a measurement target signal line, comprising;

a probe head containing:
   a conductor body to be set in one point contact with the measurement target signal line;
   an electro-optic material which changes a birefringence according to a strength of an electric field coupled by the conductor body, the electro-optic material having a first surface connected with the conductor body and a second surface facing against the first surface at which a potential is not affected by the electric field from the measurement target signal line and other signal lines;
   a laser source for irradiating a laser beam to the electro-optic material; and
a handy type probe body with the probe head attached thereto, containing polarization detection means for detecting the laser beam with a polarization changed due to a change of the birefringence of the electro-optic material as an output indicative of the measurement target electric signals propagating on the measurement target signal line, the handy type probe body having a pen-like shape that can be held by a hand of an operator realized by using the polarization detection means having linearly arranged polarization detection optics housed within the handy type probe body;
wherein the polarization detection means includes an optical system formed by the linearly arranged polarization detection optics for extracting a reflection laser beam from the electro-optic material separately from the laser beam entered into the electro-optic material, as mutually orthogonal polarization components, and two photo-detectors for converting the mutually orthogonal polarization components of the reflection laser beam extracted by the optical system into electric signals.

2. The apparatus of claim 1, wherein the conductor body has a substantially cylindrical shape with a diameter equal to 0.5 mm and a height equal to 4 mm such that the apparatus is adapted to measure the measurement target electric signals in 10 GHz.

3. The apparatus of claim 1, wherein the conductor body has a substantially cylindrical shape with a diameter equal to 2 mm and a height equal to 8.5 mm such that the apparatus is adapted to measure the measurement target electric signals in 5.5 GHz.

4. The apparatus of claim 1, wherein the electro-optic material is formed by any one of BSO($Bi_{12}SiO_{20}$), CdTe, GaAs, LN($LiNBo_3$)–55° cut, ZnTe, KD.P, CuCl, ZnS, and KTP-Z cut which are materials having a sensitivity to an electric field in a direction parallel to a propagation direction of the laser beam.

5. The apparatus of claim 4, wherein the electro-optic material has a thickness greater than or equal to 5 mm between the first surface and the second surface.

6. The apparatus of claim 4, further comprising a mirror, provided between the conductor body and the electro-optic material, for reflecting the laser beam irradiated from the laser source to the electro-optic material and passed through the electro-optic material, toward the polarization detection means.

7. The apparatus of claim 6, wherein the mirror is a surface polished mirror formed by surface polishing a surface of the conductor body facing toward the first surface of the electro-optic material.

8. The apparatus of claim 6, wherein the mirror is a metal mirror provided on the first surface of the electro-optic material.

9. The apparatus of claim 6, wherein the mirror is a dielectric multi-layer film mirror provided on the first surface of the electro-optic material.

10. The apparatus of claim 4, further comprising electrodes which are electrically insulated and separated from the conductor body, and provided on surfaces different from the first surface and the second surface of the electro-optic material.

11. The apparatus of claim 4, further comprising a transparent electrode which is electrically insulated and separated from the conductor body, and provided on the second surface of the electro-optic material.

12. The apparatus of claim 1, wherein the electro-optic material is formed by any one of LT(LiTaO$_3$), LN(LiNbO$_3$), KTP, DAST, and AANP which are materials having a sensitivity to an electric field in a direction perpendicular to a propagation direction of the laser beam.

13. The apparatus of claim 12, further comprising a dielectric multi-layer film mirror, provided on a surface other than the first surface and the second surface of the electro-optic material, for reflecting the laser beam irradiated from the laser source to the electro-optic material and passed through the electro-optic material, toward the polarization detection means.

14. The apparatus of claim 12, further comprising an electrode which is electrically insulated and separated from the conductor body, and provided on the second surface of the electro-optic material.

15. The apparatus of claim 12, further comprising an electrode which is electrically insulated and separated from the conductor body, and provided on a surface other than the first surface and the second surface of the electro-optic material.

16. The apparatus of claim 1, further comprising fixing means for fixing a positional relationship of the laser source and the polarization detection means with respect to the electro-optic material.

17. The apparatus of claim 16, wherein the fixing means fixes the positional relationship of the laser source and the polarization detection means with respect to the electro-optic material via a holder for supporting the conductor body.

18. The apparatus of claim 1, further comprising a shock absorption mechanism for absorbing a shock caused when the conductor body makes contact with the signal line and effectively reducing the shock given to the electro-optic material.

19. The apparatus of claim 18, wherein the shock absorption mechanism includes a protruded portion formed on a side surface of the conductor body, and an insulative holder for supporting the conductor body to which the protruded portion is abutted.

20. The apparatus of claim 18, wherein the shock absorption mechanism includes an insulative holder for supporting the conductor body separately from the electro-optic material, and a conductive and elastic wire for electrically connecting the conductor body and the electro-optic material.

21. The apparatus of claim 18, wherein the shock absorption mechanism includes an insulative holder having an elastic member for elastically supporting the conductor body.

22. The apparatus of claim 21, wherein the elastic member has a degree of freedom only in a direction of an optical axis of the laser beam.

23. The apparatus of claim 18, wherein the shock absorption mechanism includes a groove portion formed on a side surface of the conductor body, and an insulative holder for fixedly supporting the side surface of the conductor body through adhesive.

24. The apparatus of claim 1, further comprising a prescribed reference wiring for a voltage axis calibration, a signal source for applying a prescribed electric signal having a known voltage value to the reference wiring, means for obtaining and storing a correction factor for adjusting an output obtained by the polarization detection means when the conductor body is set in one point contact with the reference wiring to which the prescribed electric signal is applied from the signal source, with respect to the known voltage value, and means for carrying out a voltage axis calibration by multiplying the stored correction factor to the output of the polarization detection means.

25. The apparatus of claim 1, further comprising an optical amplifier for amplifying the laser beam outputted from the laser source, an optical band-pass filter for removing noise components superposed by the optical amplifier from an output of the optical amplifier, a polarization controller for linearly polarizing the laser beam outputted from the optical band-pass filter, and a polarization maintaining fiber for leading the linearly polarized laser beam outputted from the polarization controller to the electro-optic material while maintaining a polarization state.

26. The apparatus of claim 25, wherein the polarization controller includes a polarizer for linearly polarizing the laser beam, polarization adjusting means for adjusting a polarization of the laser beam entering into the polarizer, a collimate lens for collimating one part of the laser beam outputted from the polarizer into the polarization maintaining fiber, a photo-detector for converting another part of the laser beam outputted from the polarizer into an electric current, an ammeter for measuring the electric current outputted from the photo-detector, an A/D converter for converting a current value measured by the ammeter into a digital data, and a processor for controlling the polarization adjusting means by processing the digital data outputted from the A/D converter.

27. The apparatus of claim 26, wherein the polarization adjusting means includes a wave plate for changing a polarization of the laser beam, a rotation mechanism for rotating the wave plate, and a driver for outputting signals to drive the rotation mechanism according to an output of the processor.

28. The apparatus of claim 26, wherein the polarization adjusting means includes a voltage controlled polarization modulator for changing a polarization of the laser beam, and a voltage generator for outputting voltages to control a polarization modulation by the voltage controlled modulator according to an output of the processor.

29. The apparatus of claim 1, wherein the laser source includes a laser diode and a laser driver for generating electric signals to drive the laser diode.

30. The apparatus of claim 1, wherein the polarization detection means includes a wave plate for changing a polarization of the reflection laser beam, and a rotation mechanism for adjusting an intensity balance between the mutually orthogonal polarization states of the reflection laser beam by rotating the wave plate.

31. The apparatus of claim 1, wherein the polarization detection means includes a voltage controlled polarization modulator for changing a polarization of the reflection laser beam, a voltage generator for outputting voltages to control a modulation by the voltage controlled polarization modulator, and a feedback system for controlling the voltages outputted from the voltage generator according to the electric signals outputted from the two photo-detectors.

32. The apparatus of claim 1, further comprising signal processing means for processing an output of the polarization detection means, including a differential amplifier for detecting reverse phase signal components from the electric signals outputted from the two photo-detectors, and a display means for carrying out a display according to signals outputted from the signal processing means.

33. The apparatus of claim 32, wherein the signal processing means includes an electric band-pass filter and an averager for signal processing an output of the differential amplifier.

34. The apparatus of claim 1, wherein the laser source is also contained in the probe body.

35. The apparatus of claim 1, wherein the laser source irradiates a pulsed laser beam to the electr-optic material.

36. An electric signal measurement apparatus for measuring measurement target electric signals propagating on a measurement target signal line, comprising;

a probe head containing a conductor body to be set in contact with the measurement target signal line, and an electro-optic material which changes a birefringence according to a strength of an electric field coupled by the conductor body;

a laser source for irradiating a laser beam to the electro-optic material; and a handy type probe body to which the probe head is attached, the probe body containing polarization detection means for detecting the laser beam with a polarization changed due to a change of the birefringence of the electro-optic material as an output indicative of the measurement target electric signals propagating on the measurement target signal line, and the probe body having a pen-like shape that can be held by a hand of an operator realized by using the polarization detection means having linearly arranged polarization detection optics housed within the probe body;

wherein the polarization detection means includes an optical system formed by the linearly arranged polarization detection optics for extracting a reflection laser beam from the electro-optic material separately from the laser beam entered into the electro-optic material as mutually orthogonal polarization components, and two photo-detectors for converting the mutually orthogonal polarization components of the reflection laser beam extracted by the optical system into electric signals.

37. The apparatus of claim 36, wherein the laser source is also contained in the probe body.

38. The apparatus of claim 36, wherein the conductor body is set in one point contact with the measurement target signal line, and the electro-optic material has a first surface connected with the conductor body and a second surface facing against the first surface at which a potential is not affected by the electric field from the measurement target signal line and other signal lines.

* * * * *